US006633504B1

United States Patent
Lee et al.

(10) Patent No.: US 6,633,504 B1
(45) Date of Patent: Oct. 14, 2003

(54) SYNCHRONOUS DRAM HAVING TEST MODE IN WHICH AUTOMATIC REFRESH IS PERFORMED ACCORDING TO EXTERNAL ADDRESS AND AUTOMATIC REFRESH METHOD

(75) Inventors: Mahn-joong Lee, Yongin (KR); Man-sik Choi, Suwon (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/517,396

(22) Filed: Mar. 2, 2000

(30) Foreign Application Priority Data

May 4, 1999 (KR) ........................................ 1999-16002

(51) Int. Cl.[7] ................................................ G11C 7/00
(52) U.S. Cl. ...................... 365/222; 365/200; 365/201
(58) Field of Search ................................ 365/222, 200, 365/201

(56) References Cited

U.S. PATENT DOCUMENTS

| 5,450,364 | A | | 9/1995 | Stephens, Jr. et al. | |
|---|---|---|---|---|---|
| 5,991,218 | A | * | 11/1999 | Kushiyama | 365/222 |
| 6,166,980 | A | * | 12/2000 | Chun | 365/222 |
| 6,545,921 | B2 | * | 4/2003 | Ohtani et al. | 365/201 |

FOREIGN PATENT DOCUMENTS

JP            9171682         6/1997

* cited by examiner

Primary Examiner—David Nelms
Assistant Examiner—Connie C. Yoha
(74) Attorney, Agent, or Firm—F. Chau & Associates, LLP

(57) ABSTRACT

A synchronous DRAM and method are provided in which main cells and spare cells are accessed by an external address during automatic refresh of a test mode. In the synchronous DRAM, a mode register setting circuit receives an external signal in response to a plurality of control signals to generate a mode register setting signal, during an automatic refresh operation in a test mode. An address selector selects and outputs an external address to the memory cell array, in response to the activation of the mode register set signal, during the automatic refresh operation in the test mode. The address selector selects and outputs an internal address to the memory cell array, in response to the deactivation of the mode register set signal, during an automatic refresh operation in a normal mode. Therefore, the main cells and the spare cells in the memory cell array are sequentially accessed and refreshed by the external address during the automatic refresh operation in the test mode.

9 Claims, 2 Drawing Sheets

SYNCHRONOUS DRAM HAVING TEST MODE IN WHICH AUTOMATIC REFRESH IS PERFORMED ACCORDING TO EXTERNAL ADDRESS AND AUTOMATIC REFRESH METHOD

BACKGROUND OF THE INVENTION

1. Field of the Invention

The present invention relates to a semiconductor memory device, and more particularly, to a synchronous dynamic random access memory (DRAM) and method having a test mode in which an automatic refresh operation with respect to memory cell arrays can be performed by an external address.

2. Description of the Related Art

A synchronous DRAM includes main cells and spare cells, i.e., redundant cells for replacing failed cells. The synchronous DRAM also includes a plurality of banks capable of read and write operations, and independently and simultaneously, conducting an automatic refresh operation, where main cells are automatically refreshed.

In a conventional synchronous DRAM, word-lines are accessed by an external address during read and write. During an automatic refresh operation, word-lines are sequentially accessed by internal addresses. An internal address is automatically generated by an internal address counter in response to an external automatic refresh command. Thus, in the conventional synchronous DRAM, when the automatic refresh is performed, only the main cells are accessed to be automatically refreshed, and the spare cells are not accessed and thus not automatically refreshed.

In the conventional art, RAS only refresh (ROR) is performed in the spare cells. However, ROR has different refresh conditions from those of the automatic refresh, so that refresh failure of cells cannot be exactly screened in a test mode.

SUMMARY OF THE INVENTION

It is an objective of the present invention to provide a synchronous DRAM in which main cells and spare cells are accessed by an external address. As a result, both main cells and spare cells may be automatically refreshed during a test mode.

It is another objective of the present invention to provide an automatic refresh method for synchronous DRAM in which main cells and spare cells are accessed by an external address. The method may automatically refresh the accessed main and spare cells during a test mode.

According to the present invention, to achieve the first objective, a synchronous DRAM includes a mode register setting circuit which receives an external signal in response to a plurality of control signals. The external signal causes the mode register setting circuit to generate a mode register setting signal, during an automatic refresh operation in a test mode. In response to the activation of the mode register set signal during the automatic refresh operation in the test mode, an address selector selects and outputs an external address to the memory cell array. Alternatively, in response to the deactivation of the mode register set signal, during an automatic refresh operation in a normal mode, the address selector selects and outputs an internal address, which is generated from an internal address counter, to the memory cell array.

During the automatic refresh operation in the test mode, the main cells and the spare cells in the memory cell array are sequentially accessed by the external address.

To achieve the second objective, an automatic refresh method in the test mode of a synchronous DRAM includes a plurality of steps. The illustrative method applies an external signal to activate a mode register set signal. The method also applies a first logic level to the selection pin to select the main cells. When the mode register set signal is activated and the main cells are selected, the method applies an external address and an automatic refresh command from outside the synchronous DRAM to sequentially access and refresh the main cells. The method applies a second logic level to the selection pin to select the spare cells. When the mode register set signal is acted and the spare cells are selected the method applies the external address and the automatic refresh command from outside the synchronous DRAM to sequentially access and refresh the spare cells.

BRIEF DESCRIPTION OF THE DRAWINGS

The above objectives and advantages of the present invention will become more apparent by describing in detail a preferred embodiment thereof with reference to the attached drawings in which.

DESCRIPTION OF PREFERRED EMBODIMENTS OF THE INVENTION

Figure 1:
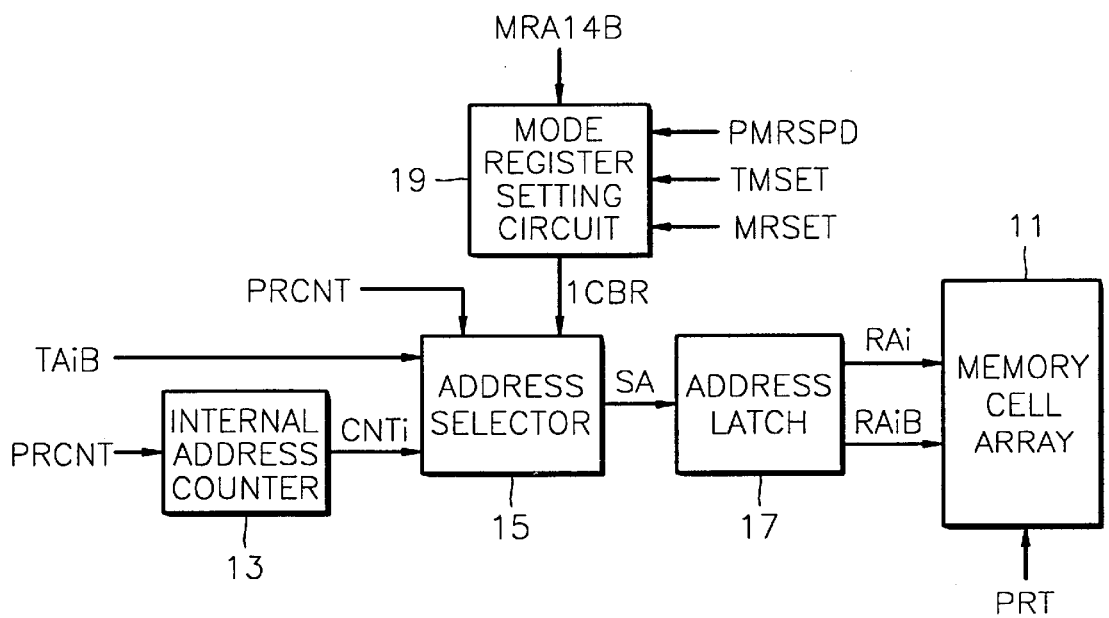
FIG. 1 is a block diagram of a synchronous DRAM according to the present invention.

The present invention now will be described more fully with reference to the accompanying drawings, in which a preferred embodiment of the invention is shown. This invention may, however, be embodied in many different forms and should not be construed as being limited to the embodiment set forth herein; rather, this embodiment is provided so that this disclosure will be thorough and complete, and will fully convey the concept of the invention to those skilled in the art. The same reference numerals in different drawings represent the same element.

Referring to FIG. 1, the synchronous DRAM according to the present invention includes a memory cell array 11, an internal address counter 13, an address selector 15, an address latch 17, and a mode register setting circuit 19.

The memory cell array 11 includes main cells used during normal operation and spare cells, i.e., redundant cells for replacing failed cells of the main cells. The internal address counter 13 automatically generates an internal address CNTi, which is sequentially increased, in response to an automatic refresh signal PRCNT. The automatic refresh signal PRCNT is activated when an external automatic refresh command is input to the synchronous DRAM.

During an automatic refresh operations in a test mode, the mode register setting circuit 19 receives an external signal MRA14B in response to a plurality of control signals PMRSPD, TMSET and MRSET. The mode register setting circuit 19 generates a mode register set signal 1CBR. When the signal MRA14B is logic low, the mode register set signal 1CBR is set to logic high. The control signals PMRSPD, TMSET and MRSET are generated inside the synchronous DRAM during the automatic refresh operation in the test mode.

During an automatic refresh operation, the address selector 15 selects the internal address CNTi or the external address TAiB in response to the mode register set signal 1CBR. Accordingly, the address selector 15 outputs the selected address SA. In detail, during the automatic refresh in the test mode, the mode register set signal 1CBR is activated to logic high so that the address selector 15 selects the external address TAiB and generates the selected address SA. During an automatic refresh in a normal mode, the mode register set signal 1CBR is deactivated to logic low so that the address selector 15 selects the internal address CNTi and generates the selected address SA.

The address latch 17 latches the selected address SA, output from the address selector 15. The address latch 17 outputs RAi and RaiB, these signals are input to an address decoder (not shown) of the memory cell array 11 to be decoded. As a result the appropriate word-lines of the main cells or the spare cells are accessed.

In other words, during the automatic refresh in the normal mode, the address selector 15, selects the internal address CNTi and outputs the selected internal address. Therefore, the word-lines of the main cells of the memory cell array 11 are sequentially accessed and the main cells are sequentially, automatically refreshed. Alternatively, during the automatic refresh in the test mode, the address selector 15 selects the external address TAiB and outputs the selected external address. Thus, the word-lines of the main cells and the spare cells can be sequentially accessed by controlling the external address TAiB. The external address TAiB sequentially and automatically refreshes the main cells and the spare cells of the memory cell array 11.

The synchronous DRAM according to the present invention, includes a selection pin PRT for accessing the main cells and the spare cells. During the automatic refresh in the test mode, the spare cells are selected when a logic high level is applied to the selection pin PRT and the main cells are selected when a logic low level is applied to the selection pin PRT.

Figure 2:
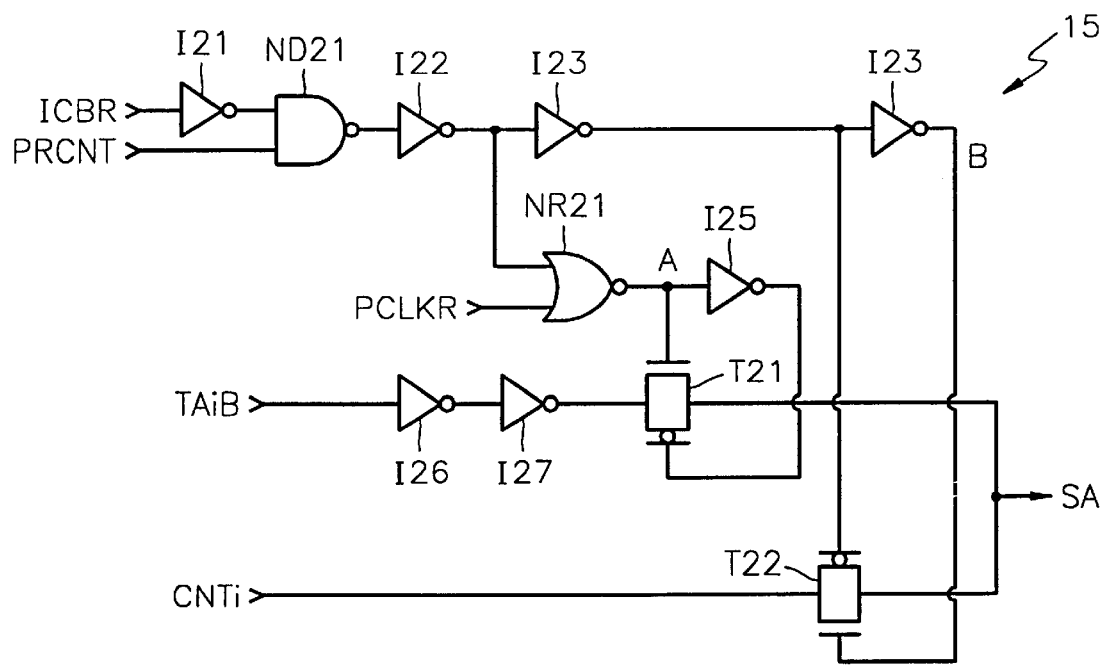
FIG. 2 is a schematic circuit diagram of the address selector of FIG. 1.

FIG. 2 is a schematic circuit diagram of the address selector of FIG. 1. Referring to FIG. 2, the address selector includes inverters 121 through 127, a NAND gate ND21, a NOR gate NR21, and transfer gates T21 and T22, and may include other logic gates if necessary.

During the automatic refresh in the test mode, the mode register set signal 1CBR and the automatic refresh signal PRCNT are activated to logic high, and PCLKR is logic low. Thus, a selection signal A becomes logic high and a selection signal B becomes logic low. Thus, the transfer gate T21 is turned on and the transfer gate T22 is turned off, so that the external address TAiB is transferred as an output SA of the address selector.

Alternatively, during the automatic refresh in the normal mode, the automatic refresh signal PRCNT is activated to logic high, the mode register set signal 1CBR is deactivated to logic low, and the PCLKR is logic low. Thus, the selection signal A becomes logic low and the signal B becomes logic high. Hence, the transfer gate T21 is turned off and the transfer gate T22 is turned on, so that the internal address CNTi is transferred as the output SA of the address selector.

Figure 3:
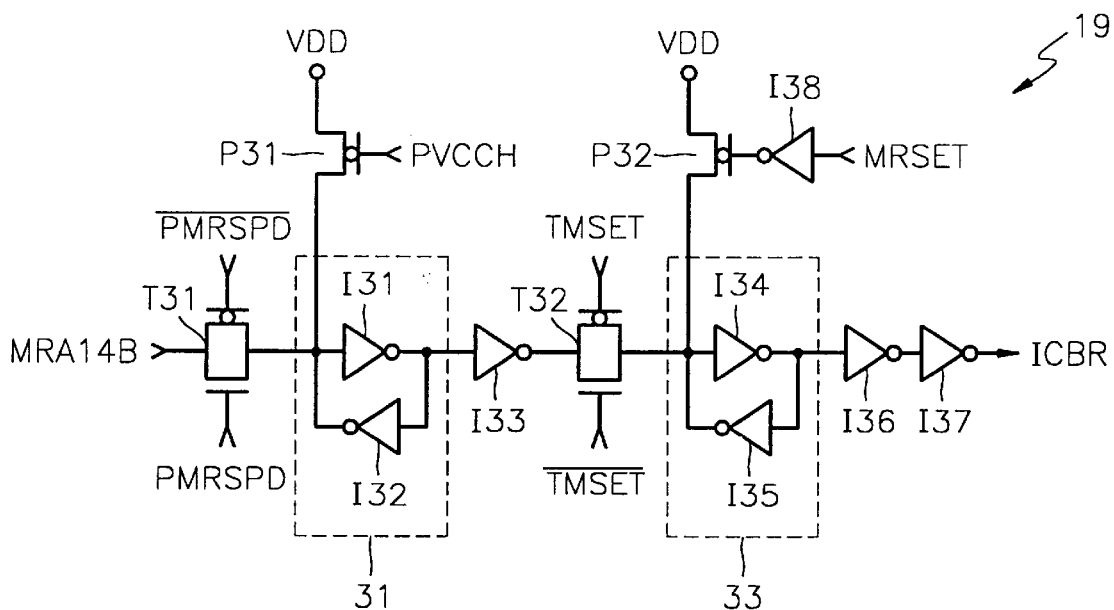
FIG. 3 is a schematic circuit diagram of the mode register setting circuit of FIG. 1.

FIG. 3 is a schematic circuit diagram of the mode register setting circuit of FIG. 1. Referring to FIG. 3, the mode register setting circuit 19 includes a first switching means T31 composed of a transfer gate, a first latch 31 composed of inverters 131 and 132, an inverter 133, a second switching means T32 composed of a transfer gate, a second latch 33 composed of inverters 134 and 135, a buffering means composed of inverters 136 and 137, an inverter 138, and first and second precharge means P31 and P32 composed of PMOS transistors. The mode register setting circuit may include other logic gates, if necessary.

The first switching means T31 switches an external signal MRA14B in response to the first mode register control signal PMRSPD. The first latch 31 latches the output of the first switching means T31. The inverter 133 inverts the output of the first latch 31. The second switching means T32 switches the output of the inverter 133 in response to the test mode control signal TMSET. The second latch 33 latches the output of the second switching means T32. The buffer means buffers the output of the second latch 33 and outputs the mode register set signal 1CBR.

The first precharge means P31, precharges the input terminal of the first latch 31 to logic high in response to a precharge control signal PVCCH. The second precharge means P32 precharges the input terminal of the second latch 33 to logic high in response to an inverted version of the second mode register control signal MRSET.

During the automatic refresh in the test mode, the control signals PMRSPD, TMSET and PVCCH become logic high, and the control signal MRSET becomes logic low. Thus, the switching means T31 and T32 are turned on and the precharge means P31 and P32 are turned off. When a signal MRA14B applied through a predetermined circuit from the outside becomes logic low, the mode register set signal 1CBR becomes logic high.

Alternatively, during the automatic refresh in the normal mode, the control signals PMRSPD and TMSET become logic low and the control signal MRSET becomes logic high. Thus, the switching means T31 and T32 are turned off and the precharge means P32 is turned on. Thus, the mode register set signal 1CBR becomes logic low.

Figure 4:
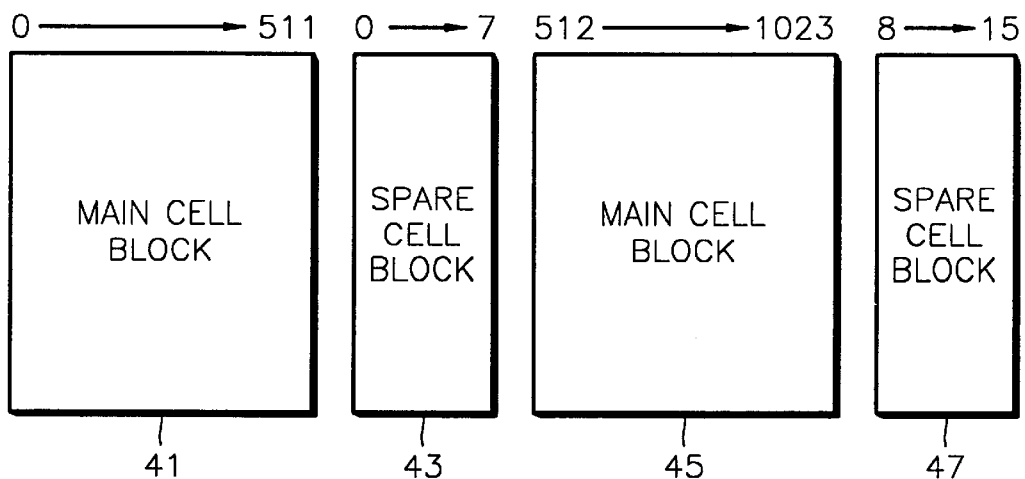
FIG. 4 is a schematic diagram of a structure of the memory cell array of FIG. 1.

FIG. 4 is a schematic view of a structure of the memory cell array of FIG. 1. Referring to FIG. 4, the memory cell array includes a main cell block 41 having addresses of 0 through 511, a main cell block 45 having addresses of 512 through 1023, a spare cell block 43 having addresses of 0 through 7, and a spare cell block 47 having addresses 8 through 15. The addresses indicate addresses for accessing a word-line. It can be understood that the number of main cell blocks and spare cell blocks which are two in FIG. 4, may be increased.

The automatic refresh method and operation of the synchronous DRAM according to the present invention will be described in detail with reference to FIG. 4.

During the automatic refresh in the normal mode, an external automatic refresh command is applied. As described above, the address selector 15 selects the internal address CNTi which is generated from the internal address counter 13 and sequentially increased. The address selector 15 outputs the selected address, to an address decoder (not shown) of the main cell blocks 41 and 45. The selected address is decoded by the address decoder.

Thus, word-lines corresponding to the addresses 0 through 511 of the main cell block 41, and the addresses 512 through 1023 of the main cell block 45, are sequentially accessed so that only the main cells are sequentially refreshed.

Alternatively, during the automatic refresh in the test mode, a predetermined external signal is applied and thus the mode register set signal 1CBR is activated to logic high. That is, when the predetermined external signal is activated to logic high, the input signal MRA14B of the mode register setting circuit 19 becomes logic low. Therefore, the mode register set signal 1CBR is activated to logic high.

Then, the main cell block 41 is selected by applying a logic low level to the selection pin PRT. In the state in which the mode register set signal 1CBR is activated and the main cell block 41 is selected, the external address and the automatic refresh command are applied from outside the synchronous DRAM. Thus, as described above, the address selector 15 selects the external address TAiB and outputs the selected address to an address decoder (not shown) of the main cell block 41. The selected address is decoded by the address decoder. Thus, the word-lines corresponding to the addresses 0 through 511 of the main cell block 41 are sequentially accessed, so that the main cells of the main cell block 41 are sequentially refreshed.

The spare cell block 43 is selected by applying a logic high level to the selection pin PRT. In the state in which the mode register set signal 1CBR is activated and the spare cell block 43 is selected, the external address and the automatic refresh command are applied from outside the synchronous DRAM. Thus, the address selector 15 selects the external address TAiB and outputs the selected address. The external address TAiB is input to an address decoder (not shown) of the spare cell block 43 and the external address is decoded. Thus, the word-lines corresponding to the addresses 0 through 7 of the spare cell block 43 are sequentially accessed so that the spare cells of the spare cell block 43 are sequentially refreshed.

In the same manner as described above, the word-lines corresponding to the addresses 512 through 1023 of the main cell block 45 are sequentially accessed so that the main cells of the main cell block 45 are sequentially refreshed. Also, the word-lines corresponding to the addresses 8 through 15 of the spare cell block 47 are sequentially accessed so that the spare cells of the spare cell block 47 are sequentially refreshed.

As described above, according to a synchronous DRAM and an automatic refresh method of the present invention, main cells and spare cells can be accessed by an external address during the automatic refresh of a test mode, and main cells and spare cells can be automatically refreshed. Thus, due to the same refresh conditions of the main cell and the spare cells, refresh failure of the cells in a test mode can be exactly screened.

What is claimed is:

1. A synchronous DRAM comprising:
   a memory cell array including main cells and spare cells;
   an internal address counter for automatically generating an internal address in response to a refresh signal;
   a mode register setting circuit for receiving an external signal in response to a plurality of control signals generating a mode register setting signal, during an automatic refresh operation in a test mode; and
   an address selector for selectively outputting an external address and the internal address to the memory cell array, in response to the mode register set signal, and wherein the external address is selected by the address selector to sequentially access the main cells and the spare cells and automatically refresh the accessed cells during an automatic refresh operation in the test mode.

2. The synchronous DRAM of claim 1, wherein the internal address is selected by the address selector to sequentially access the main cells and automatically refresh the accessed main cells during an automatic refresh operation of a normal mode.

3. The synchronous DRAM of claim 1, wherein the mode register setting circuit comprises:
   a first switching means that switches the external signal in response to a first mode register control signal;
   a first latch that latches the output of the first switching means;
   an inversion means for inverting the output of the first latch;
   a second switching means for switching an output of the inversion means in response to a test mode control signal;
   a second latch that latches the output of the second switching means; and
   a buffering means for buffering the output of the second latch to output the mode register set signal.

4. The synchronous DRAM of claim 3, wherein the mode register setting circuit further comprises:
   a first precharging means for precharging the input terminal of the first latch in response to a precharge control signal; and
   a second precharging means for precharging the input terminal of the second latch in response to the inversion signal of a second mode register control signal.

5. The synchronous DRAM of claim 1, wherein the address selector comprises:
   a logic means for logically operating the mode register set signal and the refresh signal to generate a selection signal;
   a first switching means for switching the external address to the memory cell array in response to the selection signal; and
   a second switching means for switching the internal address to the memory cell array in response to the selection signal.

6. The synchronous DRAM of claim 5, wherein the selection signal is activated when the refresh signal and the mode register set signal are activated, and deactivated when the refresh signal is activated and the mode register set signal is deactivated.

7. The synchronous DRAM of claim 5, wherein the first switching means transfers the external address to the memory cell array during activation of the selection signal.

8. The synchronous DRAM of claim 5, wherein the second switching means transfers the internal address to the memory cell array during deactivation of the selection signal.

9. An automatic refresh method in a test mode of a synchronous DRAM including a memory cell array having main cells and spare cells, and a selection pin for accessing the main cells and the spare cells, comprising the steps of:
   applying an external signal to activate a mode register set signal;
   applying a first logic level to the selection pin to select the main cells;
   applying an external address and a refresh command from the outside of the synchronous DRAM to sequentially access and refresh the main cells, when the mode register set signal is activated and the main cells are selected;
   applying a second logic level to the selection pin to select the spare cells; and
   applying the external address and the refresh command from the outside of the synchronous DRAM to sequentially access and refresh the spare cells, when the mode register set signal is activated and the spare cells are selected.

* * * * *